United States Patent [19]

McGhee

[11] Patent Number: 4,461,524

[45] Date of Patent: Jul. 24, 1984

[54] FRAME TYPE ELECTRICAL CONNECTOR FOR LEADLESS INTEGRATED CIRCUIT PACKAGES

[75] Inventor: James B. McGhee, El Cajon, Calif.

[73] Assignee: Teledyne Industries, Inc., Los Angeles, Calif.

[21] Appl. No.: 385,536

[22] Filed: Jun. 7, 1982

[51] Int. Cl.³ .............................................. H01R 23/72
[52] U.S. Cl. ................................. 339/75 MP; 29/884; 339/17 CF
[58] Field of Search .......... 339/17 CF, 17 M, 17 LM, 339/75 M, 75 MP, 174; 174/52 FP; 29/883, 884, 827; 220/337, 340

[56] References Cited

U.S. PATENT DOCUMENTS

| | | | |
|---|---|---|---|
| 2,642,987 | 6/1953 | Castelli | 220/340 |
| 3,789,341 | 1/1974 | Dalmasso | 339/17 CF |
| 4,349,120 | 9/1982 | DiNardo | 220/337 |
| 4,354,720 | 10/1982 | Bakermans | 339/17 CF |
| 4,393,581 | 7/1983 | Cherian | 339/17 CF |
| 4,395,084 | 7/1983 | Conrad | 29/884 |
| 4,402,562 | 9/1983 | Sado | 339/DIG. 3 |

Primary Examiner—Neil Abrams
Attorney, Agent, or Firm—Reagin & King

[57] ABSTRACT

A frame-type electrical connector for connecting leadless integrated circuit packages to a printed circuit board is disclosed. The connector includes a frame member having generally rectangular sides. A lead frame containing a plurality of flat conductive elements is molded in place in each of the sides of the frame. After molding, the conductive elements are shaped to form both pressure contacts and pin terminals. The pressure contacts are designed to contact the leadless package, and the pin terminals are designed to be soldered into the printed circuit board.

6 Claims, 11 Drawing Figures

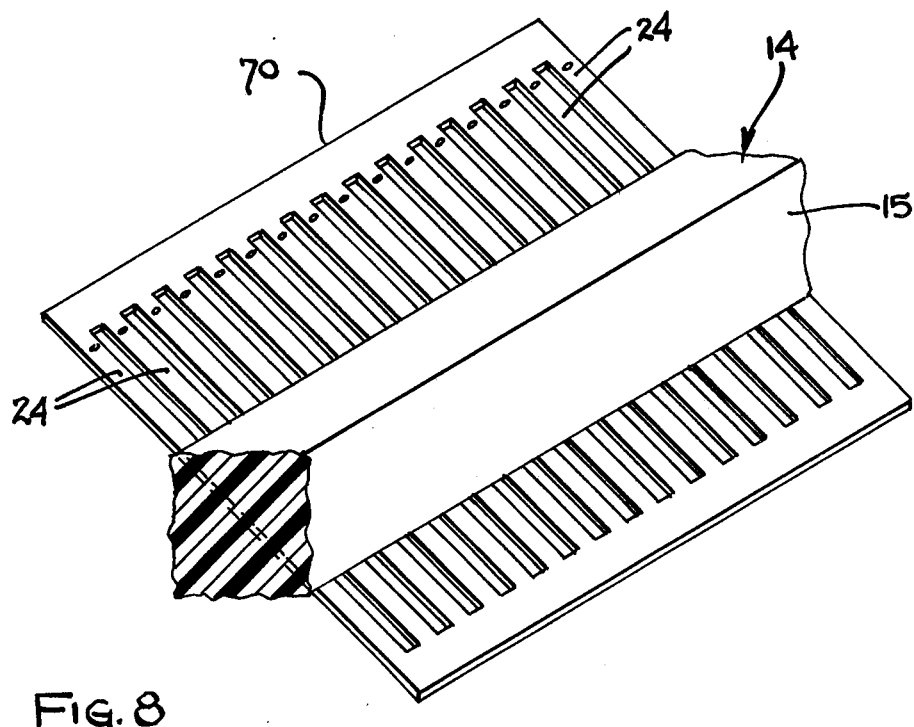
FIG. 8
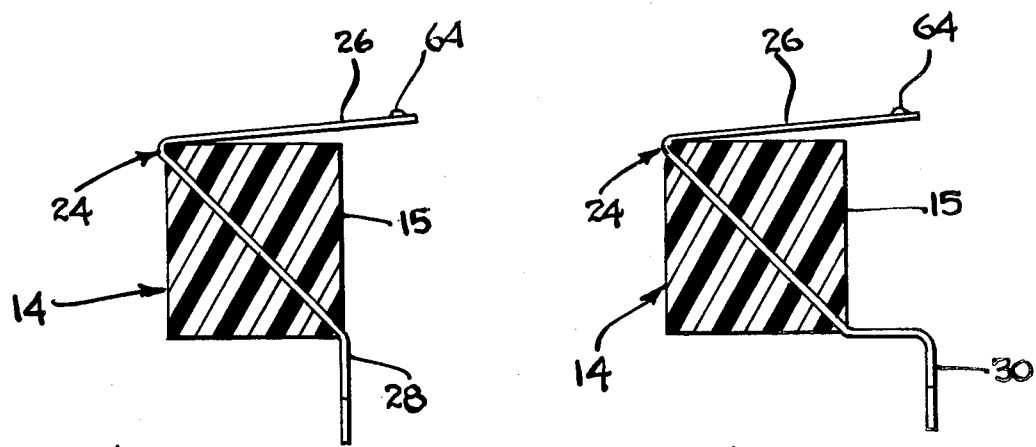
FIG. 10
FIG. 11

FRAME TYPE ELECTRICAL CONNECTOR FOR LEADLESS INTEGRATED CIRCUIT PACKAGES

BACKGROUND OF THE INVENTION

This invention relates to electrical connectors and more particularly to a frame-type electrical connector having molded in place terminals and used for connecting leadless integrated circuit packages to a printed circuit board.

Connectors of the class to which this invention relates employ a base in the form of a frame which has a cavity in the top surface thereof designed to receive a leadless package. A plurality of conductive elements are mounted along the periphery of the cavity and are shaped to form pressuretype electrical contacts.

The leadless package, typically in the form of a thin rectangular substrate having a plurality of conductive areas or pads spaced along its edges, is mounted within the cavity of the frame so that the conductive pads on the package face the pressure contacts. A cover is then placed over the package to the backside of the leadless package, causing the conductive pads to compress the pressure contacts. The conductive elements mounted within the frame are designed so that one end of each of these contacts projects below the bottom surface of the frame, to form a set of pin terminals designed to be soldered into mating holes in a printed circuit board. By soldering the pin terminals into the printed circuit board, electrical contact is established between the conductive pads on the leadless package and the corresponding conductors on the printed circuit board. Because of the close spacings between adjacent conductive elements, it is often desirable to shape the pin terminals so that adjacent terminals form a staggered arrangement which increases the effective distance between the terminals.

Some of the prior art connectors are designed so that individual conductive elements are inserted into the frame after the frame has been formed by means such as molding. For example, Palecek U.S. Pat. No. 3,953,101, issued Apr. 27, 1976, shows a connector designed with insertable contacts. This type of connector design requires the frame to be fabricated with means for retaining the individual contacts after they are inserted. The contacts themselves must be formed into an intricate shape both to provide the required pressure contact and to engage the retaining means in the frame, and each contact must be properly oriented when it is inserted into the frame. Generally, frame-type connectors employing insertable contacts are larger and more difficult and costly to assemble than those connectors employing molded-in contacts. In addition, insertable contacts do not possess the strength or ruggedness of molded-in contacts.

Other prior art connectors of the class to which this invention relates employ conductive elements which are molded into place along the periphery of the frame at the same time that the frame is formed. In the prior art, this type of construction, known as insert-molding, requires that each conductive element be preformed prior to assembly to form both a pressure contact and a pin terminal. Such preforming generally necessitates that conductive elements be handled one at a time and be carefully inserted into a mold in the proper orientation. Arranging the pin terminals into a staggered arrangement further complicates the performing of the contacts and results in a method of assembly that is extremely time consuming and expensive. Examples of this type of connector are shown in Cutchaw U.S. Pat. Nos. 3,904,262 and 4,063,791, issued Sept. 9, 1975 and Dec. 20, 1977, respectively.

Accordingly, it is an object of the present invention to provide a new and improved electrical connector for leadless integrated circuit packages.

It is another object of the present invention to provide a connector having molded-in conductive elements which are formed to provide pressure contacts and pin terminals after they are molded in place.

It is a further object of the present invention to provide a connector having conductive elements which may be molded in place in the form of a lead frame so that a plurality of conductive elements can be handled as a single element in the assembly of the connector.

SUMMARY OF THE INVENTION

The foregoing and other objects of the invention are accomplished by a connector which includes a generally rectangular shaped frame member having a recess in its top surface designed to receive the substrate of a leadless integrated circuit package. The four sides of the frame member are each formed as an elongated bar having a rectangular cross-section. A series of flat, parallel, spaced-apart, resilient, electrically conductive elements are molded within each of the sides of the frame. The central portion of each of the conductive elements is molded in place diagonally in relation to the rectangular cross-section of the side so that the upper end of the conductive element projects from the top outer corner of the side and the lower end of the conductive element projects from the bottom inner corner of the side.

After the conductive elements are molded in place, the upper end of each is bent so that it lies across the top surface of the side of the frame. Bending the upper end of each of the conductive elements in this manner provides a pressure contact in the form of a cantilevered spring for making connection to the leadless package. The lower end of each of the conductive elements is bent to form a pin terminal projecting vertically downward for installation in a printed circuit board. A staggered arrangement of the pin terminals is provided by alternately bending the ends of the conductive elements in an offset fashion. Because the conductive elements are molded into place in the frame before they are formed into contacts and terminals, these elements can be molded into place in the form of a flat lead frame. The lead frame allows all of the conductive elements along one side of the frame to be handled as a single component which greatly simplifies the molding and assembly of the connector of the present invention.

Other obvious features and advantages of the invention will become apparent from the reading of the specification when taken in conjunction with the drawings in which like reference numerals refer to like elements in the several views.

BRIEF DESCRIPTION OF THE DRAWINGS

FIG. 8 is a perspective view showing the lead frame molded in place in a side of the frame;

FIG. 10 is a cross-sectional view showing a conductive element bent to form a pressure contact and a pin terminal; and FIG. 11 is a cross-sectional view showing a conductive element bent to form a pressure contact and another pin terminal, to provide a staggered arrangement of pin terminals.

DESCRIPTION OF THE PREFERRED EMBODIMENT

Figure 1:
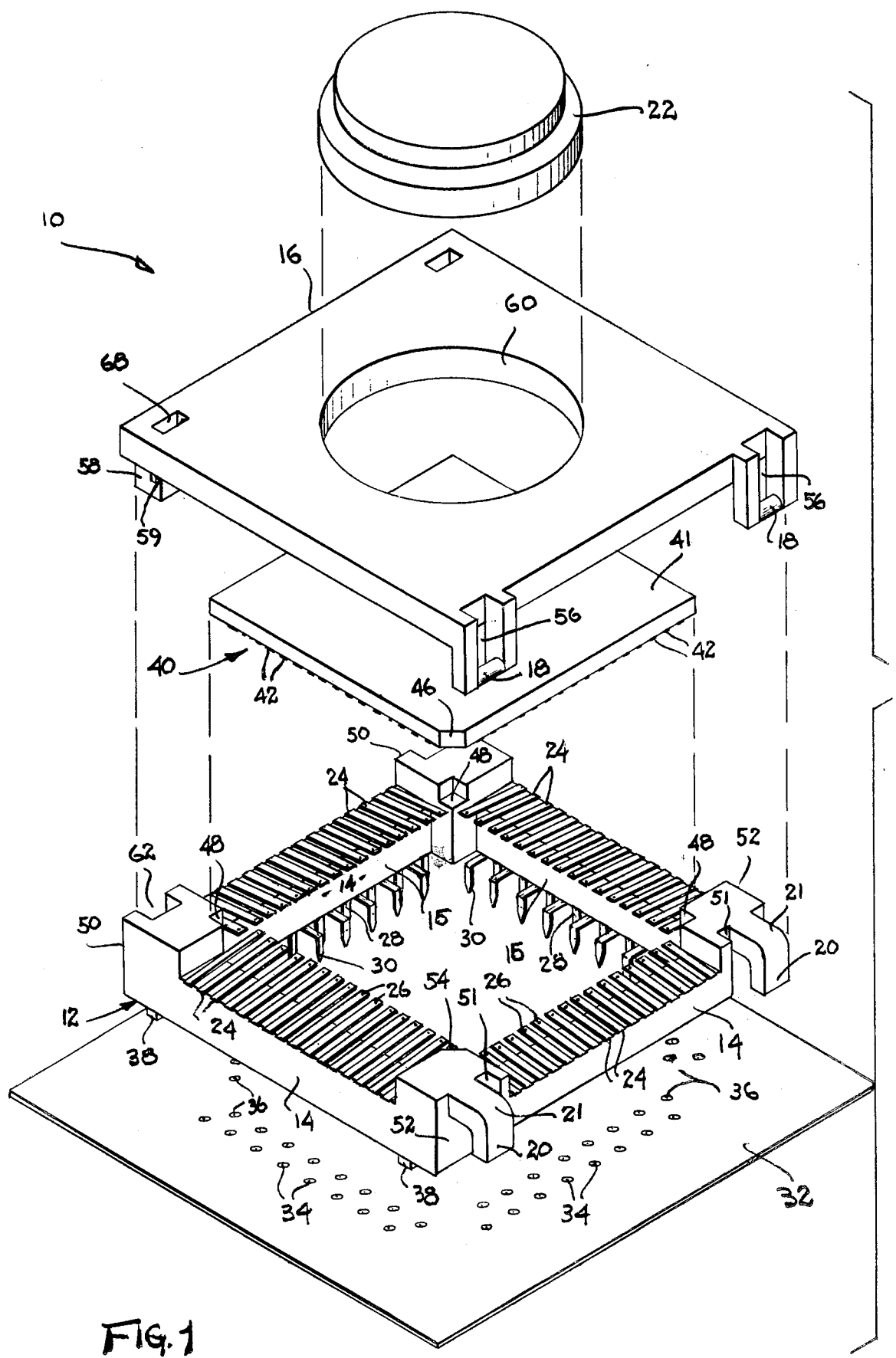
FIG. 1 is an exploded view showing the assembly of an electrical connector made according to the present invention.

Referring to FIG. 1, there is shown a perspective view showing the assembly of a connector 10 of the present invention. Connector 10 includes a generally rectangular-shaped frame member 12 having sides 14 each formed as an elongated bar having a generally rectangular cross-section. A cover 16 is also provided which is rotatably hinged to the frame 12 by engaging cylindrical bars 18 of the cover 16 with hook-shaped projections 20 provided on the frame 12. An optional heatsink 22 is also shown which may be mounted to the cover 16 to conduct heat from the leadless package in the manner described below.

Mounted within each of the sides 14 of the frame 12 are a plurality of parallel, spaced-apart, resilient, electrically conductive elements 24. The conductive elements 24 are molded diagonally within the sides 14 so that the upper ends of the elements 24 project from points to adjacent the top outside corner of the side 14 as shown in FIGS. 1, 10 and 11. These upper ends of the elements 24 are bent so that they lie across the top surface and project beyond the inside surface 15 of the side 14 forming a series of pressure contacts 26 along the upper periphery of the frame 12. The lower ends of each of the conductive elements 24 project from points adjacent to the bottom inside corner of side 14 and are bent to form pin terminals 28 and 30. The pin terminals 30 are staggered from the pin terminals 28 by first bending the lower end of every other conductive element 24 horizontally toward the center of the frame 12, and then bending them vertically. Thus, the pin terminals 30 alternate with and are offset from the pin terminals 28 as shown in FIG. 1.

The connector 10 is designed to be mounted to a printed circuit board 32 by inserting the pin terminals 28 and 30 into mating holes 34 and 36 in the circuit board 32. The staggered arrangement of the pin terminals 28 and 30 permits greater spacing between the holes 34 and 36 of the circuit board 32 greatly simplifying its construction. Depending projections 38 are provided at each corner of the bottom surface of the frame 12. The projections 38 act as stand-offs to support the sides 14 of the frame 12 above the surface of the circuit board 32 so that the horizontal portion of the pin terminals 30 do not contact the surface of the board 32. Pin terminals 28 and 30 are soldered into place and hold the connector 10 to the board 32.

Figure 2:
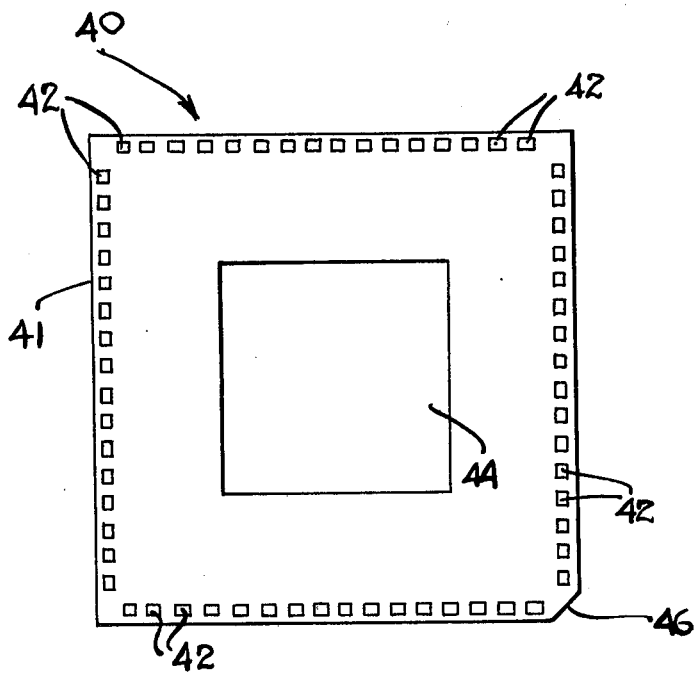
FIG. 2 is a top view of a leadless integrated circuit package which may be used with the connector of the present invention.

Referring to FIG. 2, there is shown a top view of a leadless integrated circuit package 40 to be used with the connector 10 of the present invention. The package 40 is generally in the form of a thin rectangular substrate 41 having a plurality of spaced-apart electrically conductive pads 42 positioned around the periphery of the package 40. The conductive pads 42 are in turn connected to a large scale integrated circuit mounted in the central portion of the substrate and surrounded by a protective cover 44. One corner of the substrate 41 is provided with a chamfer 46 which acts as an orientation key for the package 40.

The package 40 is inserted into the connector 10 by placing the corners of the substrate 41 into corner recesses 48 formed in corner posts 50 and 52 of the frame 12 (see FIG. 1). A chamfer 54 is provided in one of the recesses 48 and provides an orientation key in conjunction with the chamfer 46 of the package 40. When the package 40 is placed as thus described in the frame 12, each of the conductive pads 42 on the substrate 41 is in contact with one of the pressure contacts 26. The bottom surface of the recesses 48 supports the substrate 41 above the sides 14.

The cover 16 is rotatably mounted to the frame 12 by first placing the cover 16 in a vertical position so that the cylindrical bars 18 may be slipped underneath the hook-shaped projections 20 affixed to the corner posts 52. The ends of the hook-shaped projections 20 extend through openings 56 provided between the cylindrical bars 18 and the top surface of the cover 16. The flat top section of the cover 16, which is now hinged to the frame 12, is rotated over and pressed down onto the back surface of the substrate 41. The shape of the pressure contacts 26 provides a cantilevered spring pressure contact when the cover 16 is depressed onto the substrate 41. The cover 16 is retained in place by means of hook-shaped projections 58 on the cover 16 which engage with mating projections (not shown in FIG. 1) provided on the corner posts 59 of the frame 12. The connector 10 thus described provides electrical connection between each of the conductive pads 42 on the package 40 and the corresponding conductive pads on the circuit board 32 to which the connector 10 is mounted.

In another embodiment of the connector 10, the generally cylindrical heatsink 22, which may be formed of aluminum or other suitable material, is inserted into clearance hole 60 provided in the cover 16, and is fastened in place by means of a suitable adhesive. When the cover 16 is closed, the bottom surface of the heatsink 22 is brought into pressure contact with the rear surface of the substrate 41 and provides a means for cooling the integrated circuit within the package 40.

Figure 3:
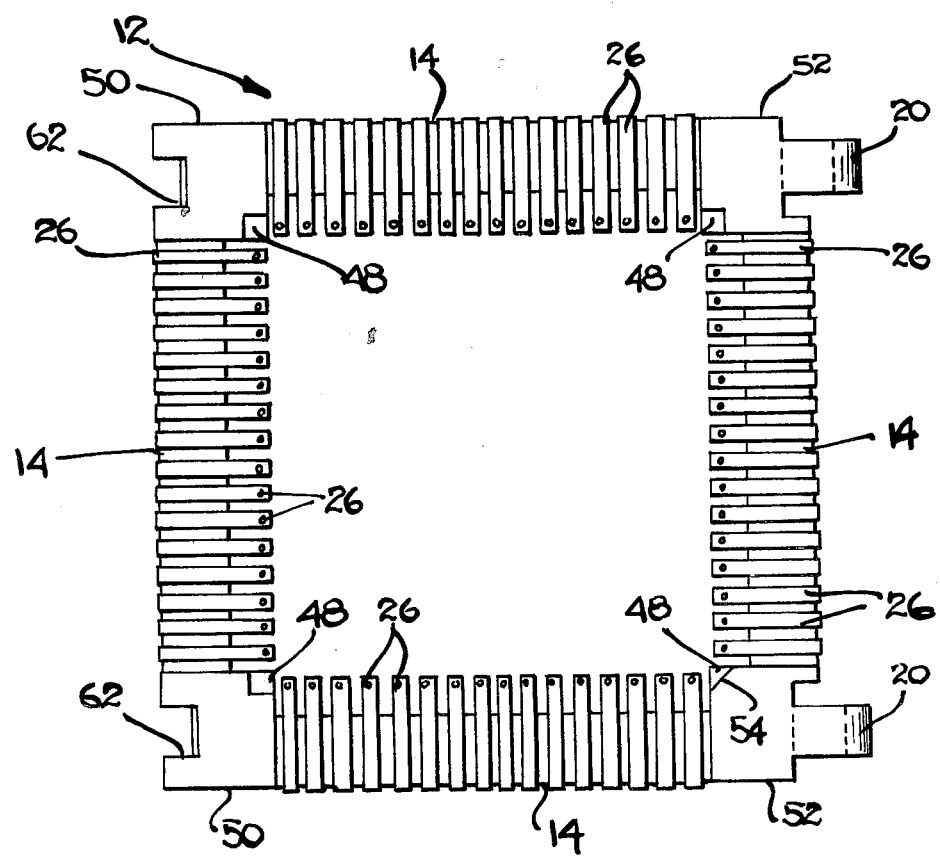
FIG. 3 is a top view of the frame member of the connector of the present invention.
Figure 4:
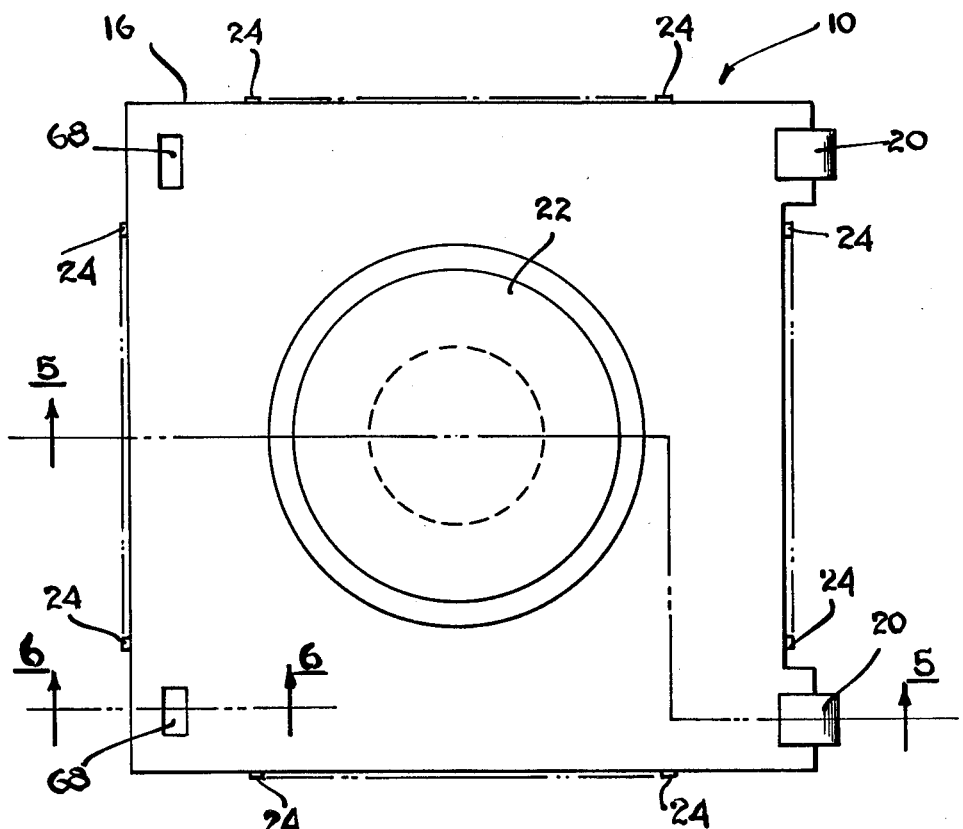
FIG. 4 is a top view of the assembled connector of the present invention.

Referring to FIGS. 3 and 4, there are shown top views of the frame 12 and the assembled connector 10, respectively. Both the frame 12 and the cover 16 may be constructed of a moldable thermoplastic material, such as Valox 420-SEO. FIG. 3 shows recesses 62 formed in the corner posts 50 which provide clearance for the hook-shaped projections 58 on the cover 16. In FIG. 4, it can be seen that a portion of each of the conductors 24 extends beyond the outer periphery of the cover 16 in the assembled connector 10. This feature permits access to the conductive elements 24 by means of a test probe so that electrical measurements and tests may be conducted without disassembling the connector 10.

Figure 5:
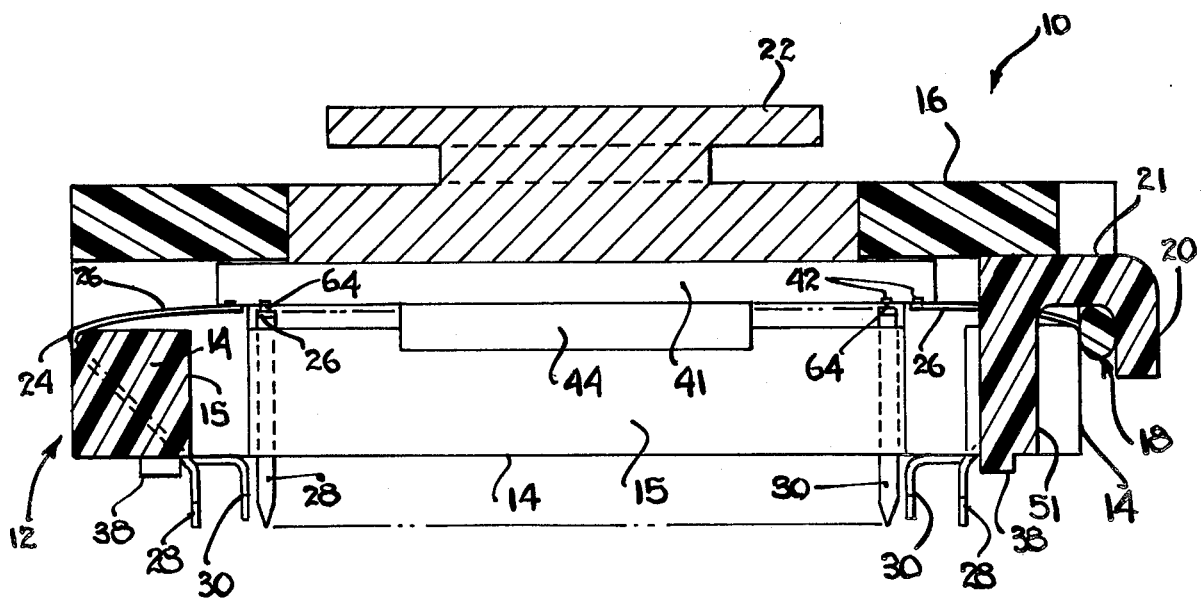
FIG. 5 is a cross-sectional view of the assembled connector taken along section 5—5 of FIG. 4.

FIG. 5 is a cross-sectional view of the connector 10 taken along the line 5-5 of FIG. 4 and showing the hinge formed by the cooperation of the cylindrical bar 18 with the hook-shaped projection 20. FIG. 5 also illustrates the shape of the conductor elements 24 when the upper ends are bent to form the pressure contacts 26 and the lower ends are bent to form the staggered arrangement of pin terminals 28 and 30. The free ends of the pressure contacts 26 are each provided with a conical protrusion forming a contact point 64 which is relatively sharp and assists in making conductive contact to the pads 42 on the substrate 41. The bottom ends of the pin terminals 28 and 30 are tapered to assist in installing them into the holes 34 and 36 of the circuit board 32.

Figure 6:
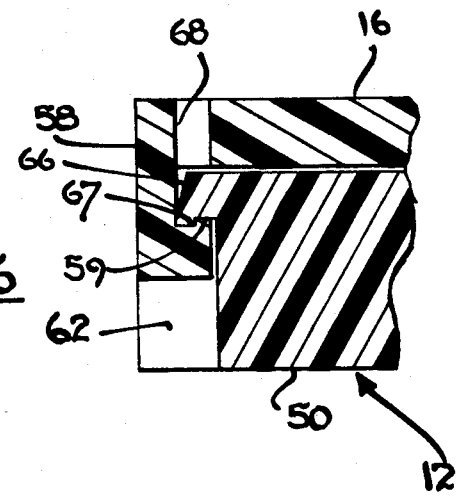
FIG. 6 is a cross-sectional view taken along Section 6—6 of FIG. 4 and showing the means for fastening the cover to the frame.

FIG. 6 is a cross-sectional view taken along the line 6—6 of FIG. 4 and showing the means of retaining the cover 16 to the frame 12. As shown in FIG. 6, hook-shaped projections 66 are provided on the corner posts 50 within the recesses 62. The cover 16 is closed by sliding it toward the recess 62 end of the frame 12 as permitted by elongated shank portion 21 of the hook-shaped projections 20 and by the recesses 51 provided in corner posts 52. The linear displacement of the cover 16 relative to the frame 12 permits the projections 58 to extend beyond the projections 66. The cover 16 is then depressed against the substrate 41 and slid back towards the projection 20 end of the frame 12. In this position, the pressure on the cover 16 is released, causing the projections 58 to engage with the projections 66 locking the cover 16 to the corner posts 50 as shown in FIG. 6. The upward force of the pressure contacts 26 acts through the substrate 41 and the cover 16 to maintain the engagement of projections 58 and 66. Protrusions 67 on projections 66 cooperate with protrusions 59 on projections 58 to prevent disengagement of the cover 16 without applying downward pressure on the cover 16. Apertures 68 within cover 16 permit molding the protrusions 59 on the projections 58. It should be noted that the means for mounting and retaining the cover 16 to the frame 12 are formed as integral parts of the cover 16 and the frame 12.

Figure 7:
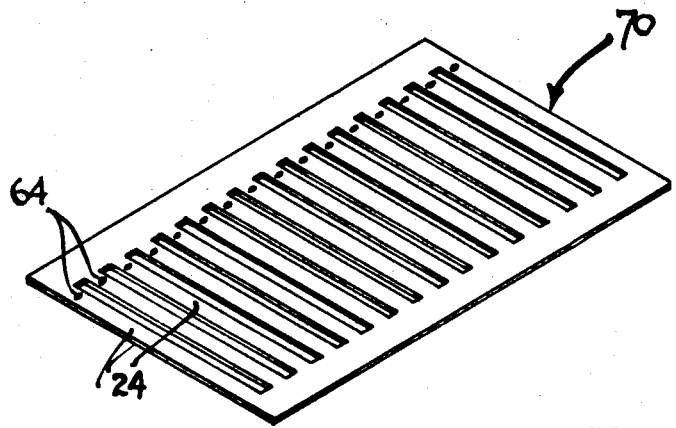
FIG. 7 is a perspective view of a lead frame which may be used to form a plurality of conductive elements.

A feature of the present invention is that the conductive elements 24 can be molded into the frame 12 in the form of lead frames. The use of lead frames enables a plurality of conductive elements 24 to be formed as a single element greatly simplifying the construction of the connector 10. FIG. 7 shows a perspective view of a lead frame 70 used to form a plurality of conductive elements 24 when they are being molded into the sides 14 of the frame 12. The lead frame 70 is a thin flat sheet or strip of conductive material such as a copper alloy in which ribbon-shaped elements 24 are formed by stamping or selectively chemically etching the frame 70. Such means of forming contacts are well known to those skilled in the art. The contact points 64 may also be formed at this stage by dimpling the lead frame 70.

FIG. 8 shows the position of the lead frame 70 when it is diagonally molded into the sides 14 of the frame 12. The lead frame 70 is configured to contain all of the conductive elements 24 required to provide contact to one side of the leadless package 40. For example, if the package 40 requires sixteen contacts on each side, four lead frames 70, each containing sixteen conductive elements, are simultaneously diagonally molded into the four sides 14 when the frame 12 is being formed. Thus, only four lead frames 70 need be handled to provide a total of sixty-four conductive elements for connector 10.

Figure 9:
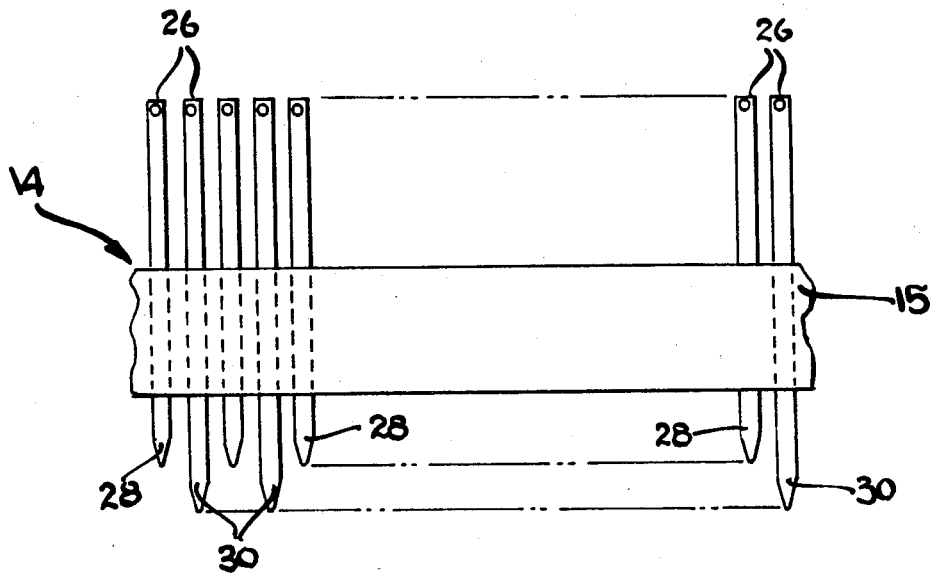
FIG. 9 is a side view showing the conductive elements after the lead frame is cut away.

After the lead frame 70 has been molded into the sides 14, the upper and lower supporting bars of the lead frame 70 are cut away, leaving the individual conductive elements 24. As shown in FIG. 9, the lower ends of the conductive elements 24 are cut at uneven lengths in an alternating pattern to form the staggered pin terminals 28 and 30 as described below. At the same time, the ends of the pin terminals 28 and 30 are cut to form a taper. A cutter has been designed so that in a single cutting operation all of the conductive elements 24 within the lead frame 70 may be cut to provide the configuration shown in FIG. 9, eliminating the need for forming or trimming individual conductive elements 24.

FIGS. 10 and 11 show how the conductive elements 24 of FIG. 9 are formed to provide the pressure contacts 26 and the pin terminals 28 and 30. It can be seen that the added length of the pin terminals 30 allows those terminals to be bent horizontally and then vertically to provide the staggered arrangement of terminals described above. Each of the upper ends of the conductive elements 24 are bent over the top surface of the side 14 to form the cantilevered pressure contacts 26. The outer, upper corners of the sides 14 are provided with a slight radius to assist in the bending of the conductive elements 24. From the above description it can be seen that the unique design of the connector 10 permits the use of conductive elements which are unbent prior to molding resulting in a connector having molded-in terminals and which can be constructed in a simple and inexpensive manner.

Further, by molding the conductive elements 24 diagonally within the sides 14, the upper ends of the elements 24 are in the proper position to form the cantilevered contacts 26. Similarly, the lower ends of the elements 24 are in the proper position to be formed into a pin terminal arrangement which occupies substantially the same area as the pad arrangement of the package 40.

While there has been shown and described the preferred embodiment of the present invention, it is to be understood that various other adaptations and modifications may be made within the spirit and scope of the invention. It is thus intended that the invention be limited in scope only by the appended claims.

What is claimed is:

1. A method of assembling an electrical connector for leadless integrated circuit packages, comprising the steps of:

forming a flat lead frame having a plurality of flat, parallel, spaced-apart, resilient, ribbon-shaped, electrically conductive elements;

embedding the central portion of the lead frame diagonally into the rectangular side of a rectangular frame member along a straight line so that the upper ends of the elements extend from points adjacent the top outer corners of the side, and the lower ends of the elements extend from points adjacent the bottom inner corners of the side;

cutting away the frame portion of the lead frame;

forming the upper ends of the elements into pressure contacts by bending them across the top surface in the direction of the inner corner of the side; and forming the lower ends of the elements into pin terminals.

2. A method of assembling an electrical connector for leadless integrated circuit packages, comprising the steps of:

forming a flat lead frame having a plurality of flat, parallel, spaced-apart, resilient, ribbon-shaped, electrically conductive elements;

embedding the central portion of the lead frame diagonally into the rectangular side of a rectangular frame member so that the upper ends of the elements extend from points adjacent the top outer corners of the side, and the lower ends of the elements extend from points adjacent the bottom inner corners of the side;

cutting away the frame portion of the lead frame;

forming the upper ends of the elements into pressure contacts;

forming the lower ends of the elements into pin terminals;

forming a cover having a flat top, two hook-shaped projections depending from the corners at one end thereof, and cylindrical rods supported at their ends and depending from the corners at the other end thereof, the rods forming apertures between the rods and the top of the cover;

forming the frame having a first set of hook-shaped projections extending from two corners at one end of the frame, and a second set of hook-shaped projections extending from two corners at the other end of the frame;

engaging the first set of hook-shaped projections of the frame through the apertures of the cover;

rotating the cover onto the frame;

sliding the cover in a first direction so that the projections on the cover extend outward of and clear the second set of hook-shaped projections on the frame;

depressing the cover; and sliding the cover in a second direction opposite to the first direction so that the projections on the cover engage with the second set of hook-shaped projections on the frame.

3. The method of claim 2 in which forming the upper ends of the elements includes the step of bending the upper ends of each of the elements down and across the top surface of the rectangular side to form a cantilevered spring pressure contact.

4. The method of claim 2 in which forming the lower ends of the elements includes the step of bending the lower ends of each of the elements so that they vertically depend from the bottom surface of the side.

5. The method of claim 4 further including the step of bending a portion of the lower end of every other conductive element horizontally and toward the center of the frame to create a staggered arrangement of pin terminals.

6. A connection for making electrical connections to leadless integrated circuit packages, comprising:

a generally rectangular frame formed of bar shaped sides; a plurality of resilient conductive elements, each having a flat central portion which is diagonally embedded into one side of the frame along a straight line, where the upper end of each element extends from a point adjacent the top outer corner of the side and is bent across the top surface in the direction of the inner corner of the side to form a cantilevered spring pressure contact, and where the lower end of each element extends from a point adjacent the bottom inner corner of the side and is bent to vertically depend from the bottom surface of the side to form a pin terminal; and a cover which fits over the frame to retain the leadless package in contact with the pressure contacts.

* * * * *